United States Patent
Wang et al.

(10) Patent No.: US 11,916,415 B2
(45) Date of Patent: Feb. 27, 2024

(54) SYSTEMS AND APPARATUS FOR CHARGING PORTABLE ELECTRICAL ENERGY STORAGE DEVICES

(71) Applicant: Gogoro Inc., Hong Kong (CN)

(72) Inventors: Yu-Jung Wang, New Taipei (TW); Chen-Hsin Hsu, New Taipei (TW); Chi-Chun Chen, Keelung (TW)

(73) Assignee: Gogoro Inc., Hong Kong (CN)

( * ) Notice: Subject to any disclaimer, the term of this patent is extended or adjusted under 35 U.S.C. 154(b) by 0 days.

(21) Appl. No.: 15/774,942

(22) PCT Filed: Nov. 9, 2016

(86) PCT No.: PCT/US2016/061159
§ 371 (c)(1),
(2) Date: May 9, 2018

(87) PCT Pub. No.: WO2017/083405
PCT Pub. Date: May 18, 2017

(65) Prior Publication Data
US 2018/0359877 A1    Dec. 13, 2018

Related U.S. Application Data

(60) Provisional application No. 62/253,038, filed on Nov. 9, 2015.

(51) Int. Cl.
*H02J 7/00* (2006.01)
*H05K 7/20* (2006.01)
(Continued)

(52) U.S. Cl.
CPC .......... *H02J 7/0042* (2013.01); *H01M 10/46* (2013.01); *H01M 10/6556* (2015.04);
(Continued)

(58) Field of Classification Search
CPC .......... H05K 7/20145; H05K 7/20136; H05K 7/2039; H05K 7/20; H02J 7/00309;
(Continued)

(56) References Cited

U.S. PATENT DOCUMENTS 3,785,378 A   1/1974   Stewart
4,743,104 A   5/1988   Eng et al.
(Continued)

FOREIGN PATENT DOCUMENTS

EP   940864 A2 *   9/1999   .............. B25F 5/008
EP   0951127 A2   10/1999
(Continued)

OTHER PUBLICATIONS

European Patent Office, EP Application No. 16864924.2, Applicant: Gogoro Inc., Supplemental European Search Report dated Nov. 18, 2018, 11 pages.
(Continued)

*Primary Examiner* — Richard Isla
*Assistant Examiner* — Manuel Hernandez
(74) *Attorney, Agent, or Firm* — Perkins Coie LLP

(57) ABSTRACT

A battery charging apparatus includes a battery compartment having a receptacle that is configured to receive a battery pack. The battery charging apparatus includes a first heat exchange module and/or a second heat exchange module. The first heat exchange module includes a plenum surrounding the receptacle, where the plenum includes a chamber to receive a fluid. The plenum also includes a plurality of flow guides disposed in the chamber to define a variable flow passage for the fluid. The second heat exchange module includes a battery connector and a heat sink thermally coupled to the battery connector. The heat sink is arranged to dissipate thermal energy from the battery pack.

15 Claims, 11 Drawing Sheets

(51) Int. Cl.
*H01M 10/6563* (2014.01)
*H01M 10/6556* (2014.01)
*H01M 10/6561* (2014.01)
*H01M 10/46* (2006.01)

(52) U.S. Cl.
CPC ... *H01M 10/6561* (2015.04); *H01M 10/6563* (2015.04); *H02J 7/0013* (2013.01); *H02J 7/0045* (2013.01); *H02J 7/00309* (2020.01); *H05K 7/20* (2013.01); *H05K 7/2039* (2013.01); *H05K 7/20136* (2013.01); *H05K 7/20145* (2013.01)

(58) Field of Classification Search
CPC ...... H02J 7/0042; H02J 7/0013; H02J 7/0045; H01M 10/6561; H01M 10/46; H01M 10/6563; H01M 10/6556
USPC .......................................................... 320/113
See application file for complete search history.

(56) References Cited

U.S. PATENT DOCUMENTS

| | | | |
|---|---|---|---|
| 5,087,214 A | 2/1992 | Dewar | |
| 5,230,016 A | 7/1993 | Yasuda | |
| 6,066,938 A * | 5/2000 | Hyodo | H02J 7/0042 320/114 |
| 6,218,807 B1 * | 4/2001 | Sakaue | H01M 2/1055 320/107 |
| 6,373,228 B1 * | 4/2002 | Sakakibara | H02J 7/0042 320/150 |
| 6,419,450 B1 | 7/2002 | Lum | |
| 6,455,186 B1 * | 9/2002 | Moores, Jr. | B25F 5/008 320/113 |
| 6,566,005 B1 * | 5/2003 | Shimma | H01M 10/6551 429/71 |
| 6,783,886 B1 * | 8/2004 | Sakakibara | H01M 10/6555 429/120 |
| 6,956,354 B2 * | 10/2005 | Lie | H02J 7/0042 320/107 |
| 7,446,508 B2 * | 11/2008 | Aradachi | H02J 7/007194 320/150 |
| 7,868,588 B2 | 1/2011 | Altekruse et al. | |
| 7,939,193 B2 | 5/2011 | Moores, Jr. et al. | |
| 10,827,655 B2 * | 11/2020 | Truettner | H05K 7/20172 |
| 11,495,844 B2 * | 11/2022 | Sedlmayr | H01M 10/6561 |
| 11,670,808 B2 * | 6/2023 | Silha | H02J 7/0013 320/134 |
| 2002/0034682 A1 * | 3/2002 | Moores, Jr. | H02J 7/0044 429/71 |
| 2004/0070368 A1 * | 4/2004 | Heigl | H02J 7/00 320/109 |
| 2004/0196009 A1 * | 10/2004 | Yang | H02J 7/0042 320/150 |
| 2006/0214642 A1 * | 9/2006 | Miyazaki | H02J 7/0042 320/150 |
| 2007/0236177 A1 * | 10/2007 | Phillips | H01M 50/227 429/82 |
| 2007/0247111 A1 * | 10/2007 | Kaji | H02J 7/0027 320/107 |
| 2012/0212175 A1 | 8/2012 | Sharaf et al. | |
| 2013/0224528 A1 | 8/2013 | Johnson et al. | |
| 2013/0294019 A1 | 11/2013 | LaSota et al. | |
| 2014/0132211 A1 | 5/2014 | Kim et al. | |
| 2017/0063116 A1 * | 3/2017 | Koch | H02J 7/0045 |
| 2018/0376625 A1 * | 12/2018 | Truettner | G01K 1/14 |
| 2020/0366114 A1 * | 11/2020 | Eivaz | H01M 50/231 |
| 2020/0411923 A1 * | 12/2020 | Sedlmayr | H01M 10/6561 |
| 2021/0167430 A1 * | 6/2021 | Silha | H02J 7/0013 |
| 2022/0123569 A1 * | 4/2022 | Kataoka | H01M 10/6235 |

FOREIGN PATENT DOCUMENTS

| | | | | |
|---|---|---|---|---|
| EP | 1381134 A1 * | 1/2004 | ................ | H02J 7/00 |
| EP | 1580863 | 9/2005 | | |
| EP | 2824795 | 7/2014 | | |
| EP | 2824795 A1 * | 1/2015 | ................ | H02J 7/00 |
| JP | H0654209 U * | 7/1994 | | |
| JP | H08185898 A * | 7/1996 | | |
| JP | 11354166 A | 12/1999 | | |
| JP | 2000048864 A | 2/2000 | | |
| JP | 2001136676 A * | 5/2001 | .......... | H01M 10/613 |
| JP | 2001143768 A * | 5/2001 | .......... | H01M 10/486 |
| JP | 2001203004 A * | 7/2001 | .............. | F28F 13/08 |
| JP | 2002124306 A * | 4/2002 | | |
| JP | 2003143766 A * | 5/2003 | | |
| JP | 3780906 B2 * | 5/2006 | | |
| JP | 2016092910 A * | 5/2016 | | |
| KR | 20140065090 | 5/2014 | | |

OTHER PUBLICATIONS

Japanese Office Action received for JP Application No. JP2018-523486, Applicant: Gogoro Inc., dated Aug. 27, 2019, 3 pages.
European Communication for EP Application No. 16864924.2, Applicant: Gogoro Inc., dated Apr. 2, 2019, 6 pages.
United States Patent and Trademark Office International Searching Authority; International Search Report and Written Opinion; PCT Application No. PCT/US2016/061159; Applicant: Gogoro Inc.; dated Mar. 10, 2017; 12 pages.
European Search Report received for co-pending EP Patent Application No. 16864924.2; Applicant: Gogoro Inc., dated Apr. 30, 2020, 7 pages.

* cited by examiner

SYSTEMS AND APPARATUS FOR CHARGING PORTABLE ELECTRICAL ENERGY STORAGE DEVICES

CROSS-REFERENCE TO RELATED APPLICATION(S)

This application is a U.S. National Phase application of PCT/US2016/061159, filed Nov. 9, 2016, which claims priority to U.S. Provisional Patent Application No. 62/253,038, filed Nov. 9, 2015, which are incorporated herein by reference in their entireties.

BACKGROUND

Technical Field

The embodiments described herein relate to portable electrical energy storage devices, such as those used to power electric powered devices such as vehicles, consumer electronics and other electric powered devices, and heat exchange systems and methods that facilitate dissipation of heat generated in portable electrical energy storage devices, or provision of heat to the portable electrical energy storage devices during or prior to charging.

Description of the Related Art

Batteries such as lithium-ion batteries are known for storing more energy into smaller, lighter units. Lithium-ion batteries have found wide application in powering portable electronic devices such as cell phones, tablets, laptops, power tools and other high-current equipment. The low weight and high energy density also makes lithium-ion batteries attractive for use in hybrid electric vehicles and fully electric powered vehicles.

In some applications, a plurality of individual lithium-ion batteries are packaged together to form a battery pack. Such battery packs include electrical components that make electrical connection between the plurality of individual lithium-ion batteries and primary negative and positive electrical terminals of the battery pack. The negative and positive electrical terminals of the battery pack can be connected to corresponding negative and positive electrical terminals of a device to provide electric power to the device. For example, chargers for such types of battery packs often include compartments for receiving the battery pack to be charged. The battery compartment of these chargers is often a replica of the compartment contained in the device to be powered by the battery pack.

As the batteries in the battery pack, for example, are undergoing a charging process, temperature of the batteries tends to increase due to, for example, a chemical reaction that may occur in a battery solution and generate thermal energy. As the temperature of the batteries increases due to the generation of thermal energy, life expectancy and performance of the batteries can be negatively impacted. In addition, if the temperature of the batteries exceeds certain temperatures, the charging efficiency can decrease, which can cause the battery charging system to draw more electrical energy than necessary and/or cause the charging time to be increased. During the charging process, dissipating heat generated by the batteries in a uniform manner has been problematic. For example, a charger for a battery pack usually includes one or more compartments that receive battery packs that are to be charged. Such compartments generally include walls that surround at least a portion of the battery pack. Dissipating thermal energy generated by the batteries during the charging process can help maintain the batteries at or below temperatures that may negatively affect the battery's life expectancy and performance and/or the charging efficiency. When a battery pack includes a plurality of individual battery cells, dissipating thermal energy generated during the charging process uniformly from the battery pack will reduce localized portions of the battery pack, e.g., individual battery cells, reaching undesirable elevated temperatures.

In other applications, particularly, in cold climates, as temperatures of the battery packs can fall below certain temperatures, batteries tend to lose desired performance levels and can negatively affect the life cycle of the battery. For instance, in some batteries, cold temperatures can lead to electrolyte freezing, which can further lead to damage to enclosures that contain the batteries. Further, at low temperatures certain chemical reactions can lead to lowering of current production, and thus lead to loss of available energy. Providing thermal energy to the battery packs during or prior to the charging process uniformly can reduce localized portions of the battery pack, e.g., individual battery cells, having undesirably reduced temperatures.

BRIEF SUMMARY

Zero tail pipe emissions alternatives to combustion engines would greatly benefit the air quality of, and hence health of, large populations.

While the zero tail pipe emissions benefit of all-electric vehicles are appreciated, adoption of all-electric vehicles by large populations has been slow. One of the reasons appears to be the need to recharge portable electrical energy storage devices used to power the all-electric or hybrid vehicles quickly and also repeatedly with minimal effect on the performance and life expectancy of the portable electrical energy storage device.

The approaches described herein may address some of the issues which have limited adoption of zero tailpipe emissions technology, particularly as they relate to charging or recharging portable electrical energy storage devices used to power electric devices.

For example, subject matter described herein relates to portable electrical energy storage device charging apparatuses, systems and methods having heat exchange systems, apparatuses, and modules that dissipate thermal energy generated in the portable electrical energy storage devices, e.g., batteries or battery packs, or provide thermal energy to the portable electrical energy storage devices, prior to, or when such portable electrical energy storage devices are supplied with electrical power during charging or recharging. In general, exemplary embodiments described herein provide efficient and compact systems, apparatuses, and methods that can charge portable electrical energy storage devices efficiently, while dissipating thermal energy that, if not dissipated, would result in the temperature of the portable electrical energy storage device (including individual portable electrical energy storage cells contained in the portable electrical energy storage device) increasing, possibly to temperatures where the life expectancy and performance of the portable electrical energy storage device and/or the charging efficiency are adversely affected. Alternatively, the exemplary embodiments described herein provide efficient and compact systems, apparatuses, and methods that can provide thermal energy to the portable electrical energy storage device to maintain temperatures at predetermined threshold temperatures, below which life expectancy and performance of the portable electrical energy storage device and/or the charging efficiency are adversely affected.

Exemplary embodiments described herein generally include a battery charging apparatus. The battery charging apparatus can include a battery compartment having a receptacle configured to receive a battery pack and a fluid source configured to supply a cooling fluid. The battery charging apparatus can also include a first heat exchange module. The first heat exchange module can include a plenum around the receptacle, the plenum including a chamber in fluid communication with the fluid source and a plurality of flow guides disposed in the chamber. The battery charging apparatus can also include a second heat exchange module. The second heat exchange module can include a battery connector plug and a heat sink thermally coupled to the battery connector plug.

An embodiment of a battery charging system can include a battery compartment having a receptacle configured to receive a battery pack, a fluid source configured to supply a cooling fluid and a first heat exchange module. The first heat exchange module can include a plenum around the receptacle, the plenum including a chamber in fluid communication with the fluid source and a variable flow passage.

An embodiment of a system to transfer thermal energy from or to a battery pack during a battery charging process can include a battery connector, a heat sink thermally coupled to the battery connector, and an interface pad thermally coupled to the battery connector and the heat sink. The interface pad can be located between the battery connector and the heat sink.

An embodiment of a method to transfer thermal energy from or to a battery pack during charging of the battery pack by a battery charging device having a receptacle to receive the battery pack can include providing a supply of fluid and directing the fluid around a perimeter of the receptacle. The method can also include controlling a flow distribution of the fluid around the perimeter of the receptacle.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and they have been solely selected for ease of recognition in the drawings.

DETAILED DESCRIPTION

Figure 1:
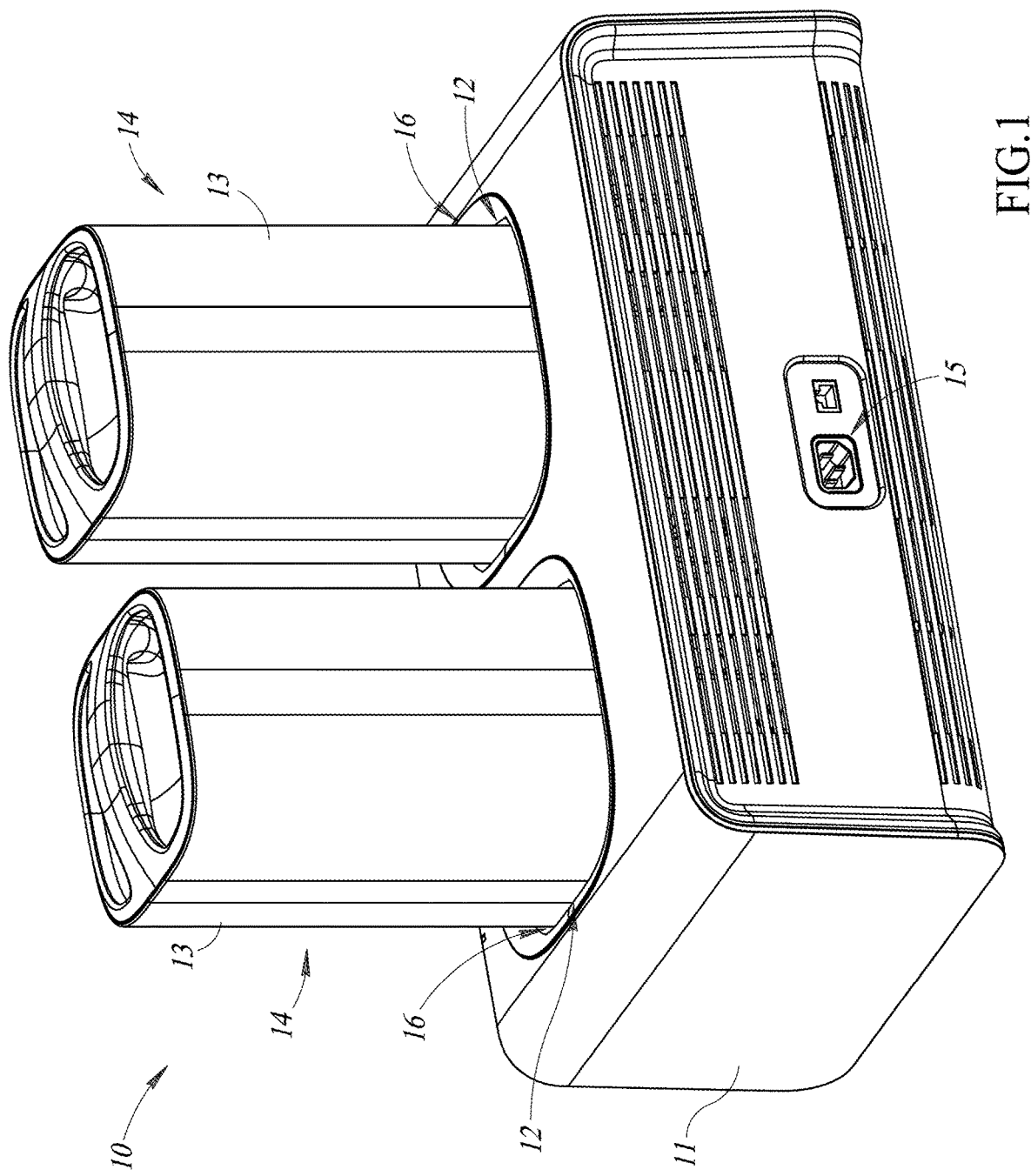
FIG. 1 is a perspective view of a battery charging system, according to a non-limiting embodiment of the subject matter described herein.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with portable electrical energy storage devices, batteries, super- or ultra-capacitors, electrical terminals, devices to be powered by portable electrical energy storage devices, devices for charging portable electrical energy storage devices and electrical connectors for electrically connecting portable electrical energy storage devices and devices to be powered by such portable electrical energy storage devices or devices for charging such portable electrical energy storage devices have not been shown or described in detail to avoid unnecessarily obscuring descriptions of the embodiments.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

The use of ordinals such as first, second and third does not necessarily imply a ranked sense of order, but rather may only distinguish between multiple instances of an act or structure.

In the figures, identical reference numbers identify similar features or elements. The sizes and relative positions of the features in the figures are not necessarily drawn to scale.

Reference to a portable electrical power storage device or a portable electrical energy storage device means any device capable of storing electrical power and releasing stored electrical power including but not limited to batteries and super or ultra-capacitors. Reference to batteries means a chemical storage cell or cells, for instance rechargeable or secondary battery cells including but not limited to nickel cadmium alloy or lithium-ion battery cells. Chemistries besides nickel cadmium alloy or lithium ion are also included in the reference to batteries or chemical storage cells. Reference to battery pack means a device that includes a plurality of individual chemical storage cells.

Reference throughout the specification to an electric powered device includes devices that can be powered by a portable electrical energy storage device and devices that are electrically powered from a source other than a portable electrical energy storage device, e.g., a device for electrically charging a portable electrical energy storage device.

Figure 2:
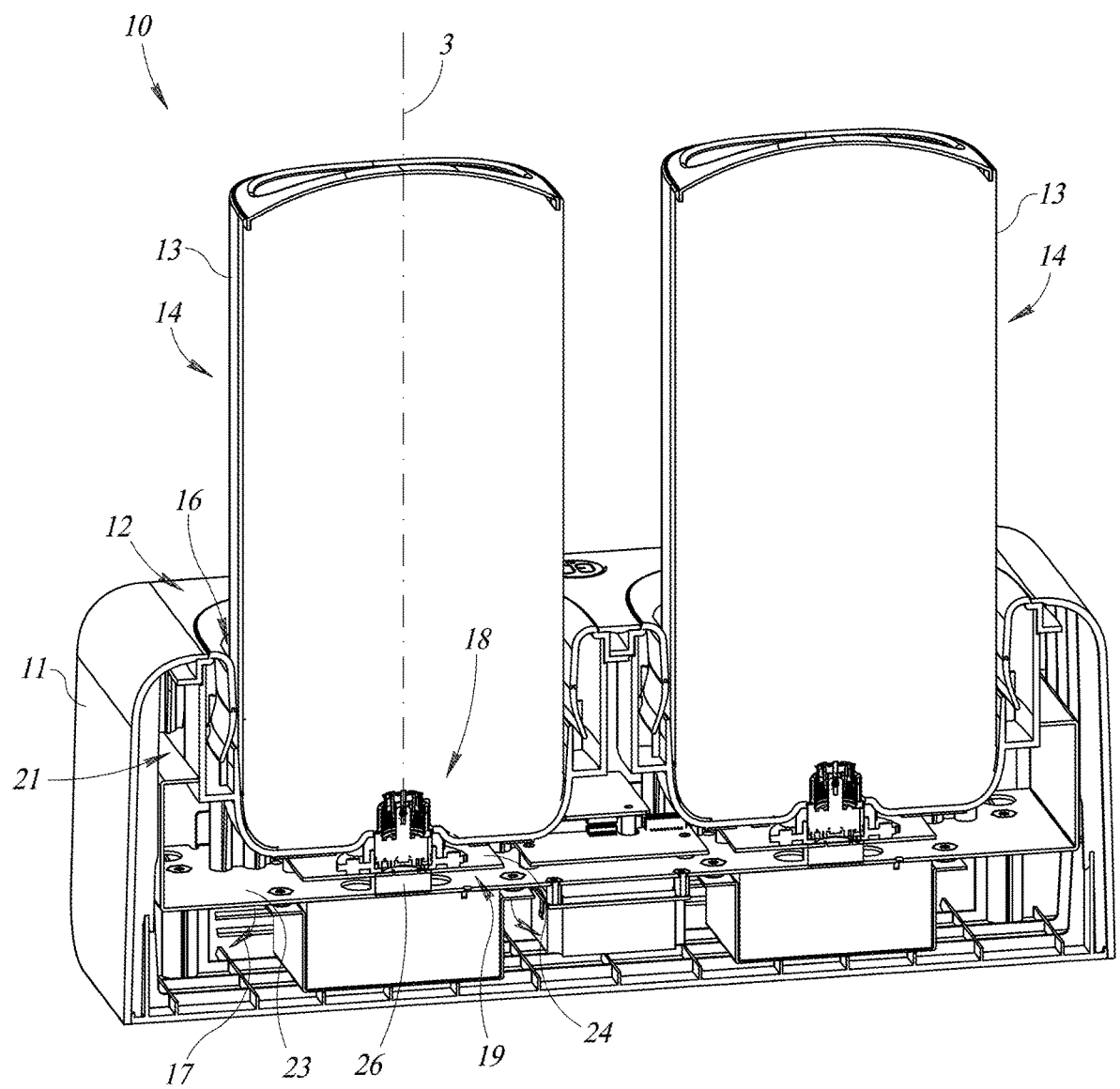
FIG. 2 is a partial cutaway perspective view of the battery charging system of FIG. 1.

Referring now to FIGS. 1 and 2, a battery charging system 10 according to one non-limiting embodiment is illustrated. The battery charging system 10 includes a housing 11 including one or more battery compartments 12 each configured to receive a battery pack 14. Each battery pack 14 includes a battery pack housing 13 which, though not illustrated, houses one or more individual portable electrical energy storage devices, e.g., a battery. These individual portable electrical energy storage devices can be arranged in different configurations, including single or multiple layers, with each layer including one or more individual electrical energy storage devices. Each battery compartment 12 includes a receptacle 16 and an electrical connector 18. In some embodiments, as illustrated in FIGS. 1 through 3A, the electrical connector 18 can include an electrical connector plug. In other embodiments, the electrical connector 18 can include a wireless charging pad capable of charging one or more battery packs 14. For example, the wireless charging pad can include one or more coils (e.g., Near Field Communication (NFC) coils or wireless charging coils) and can be coupled to a receiver that is to be charged. The receiver can include the device to be charged, e.g., the battery packs 14, and one or more antennae (e.g., NFC antennae), coils, communication and power transfer links, and other components, which are coupled to the wireless charging pad to generate a magnetic field facilitating inductive coupling of the receiver with the wireless charging pad. More generally, an example embodiment having such features can facilitate charging of the battery packs 14 via an electromagnetic field and a direct magnetic coupling without a physical electrical connection.

The receptacle 16 and the electrical connector 18 cooperate with a battery pack 14 to electrically couple the battery pack 14 to a power supply, for example, in order to facilitate conductively supplying electric current for charging of the battery pack 14. For example, though not shown, the battery pack 14 can include a receptacle for receiving and cooperating with the electrical connector 18 to electrically and thermally couple the battery pack 14 to the electrical connector 18 in the battery pack compartment 12. In this manner, the battery pack 14 can undergo a charging process where, for example, electrical current can be supplied to the battery pack 14 through an electrical connection between the electrical connector 18 and an electrical service panel via a wall outlet connector 15. In alternative embodiments, however, the battery pack 14 can undergo a charging process via an inductive coupling or magnetic resonance, for example, via a wireless charging pad coupled to a receiver including the battery packs 14, as described above.

As current flows to the battery packs 14 during the charging process, thermal energy can be generated in the batteries, in part, due to the chemical reaction that occurs in the battery solution during a charging process. If the temperature of individual battery cells in the battery packs 14 rises above a certain threshold temperature, the battery cells can suffer irreversible deterioration, for example, in the form of loss of battery charge capacity and/or can exhibit lower charging efficiencies requiring more current to charge the battery and/or longer time to charge the battery. By way of example, in some battery packs, such as those that include nickel-based battery cells, temperatures that exceed a certain threshold temperature (e.g., 45 degrees Celsius) can lower oxygen generation, which may compromise charge acceptance. By way of further example, some battery packs, such as those that include lithium-based battery cells, can have their durability compromised by prolonged exposure to temperatures that exceed certain threshold temperatures (e.g., temperatures that exceed threshold temperatures having a range of between 55-60 degrees Celsius). For instance, exposing battery cells to temperatures that exceed threshold temperatures at different states of charge, for example, at a high state of charge, can cause damage to the performance and durability of the battery cells. Damage to performance and durability of battery cells include reduced capacity, reduced lifetime, reduced charge acceptance, longer periods required to charge, reduced charge rate and reduced charging efficiency. By way of further example, exposing battery cells to temperatures that fall below threshold temperatures can decrease or reduce desired performance levels, battery cells capacity, and loss of life expectancy. The various embodiments of the battery charging system (e.g., battery charging systems 10, 110, 210) described herein provide one or more heat exchange modules that facilitate maintaining temperatures during the charging process to below certain predetermined threshold temperatures by dissipating thermal energy generated by the charging process, or provide thermal energy to maintain temperatures of the battery packs 14 at or above certain predetermined threshold temperatures.

Figure 3A:
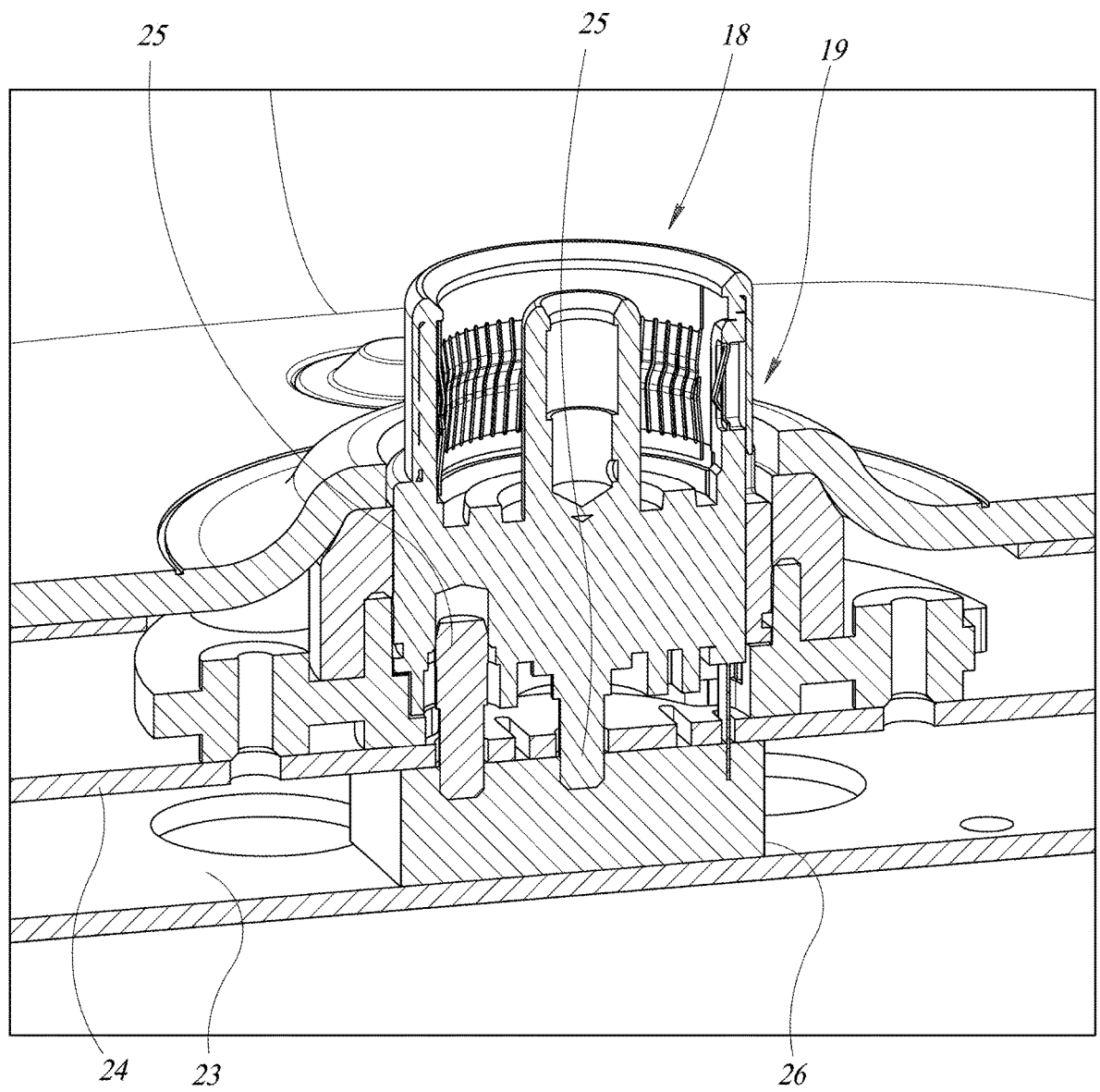
FIG. 3A is a detail perspective view of a portion of the battery charging system of FIG. 1, illustrating certain features of a heat exchange module of the battery charging system of FIG. 1, in accordance with one non-limiting embodiment of the subject matter described herein.

Referring now to FIGS. 1, 2 and 3A, the battery charging system 10 includes a first heat exchange module 19 and a second heat exchange module 21. The first heat exchange module 19, generally, facilitates removal of thermal energy generated during the charging process from battery packs 14 by conductively and/or convectively and/or radiantly dissipating the thermal energy. First heat exchange module 19 includes a heat sink 23 positioned below compartment 12. Heat sink 23 is thermally coupled to the electrical connector 18 located in battery compartment 12 and dissipates thermal energy generated in the battery pack 14 in the general direction indicated by reference numeral 17. More particularly, electrical connector 18 generally comprises an electrically conductive material, such as an electrically conductive metal, with high thermal conductivity. Non-limiting embodiments of such electrically conductive materials with high thermal conductivity include stainless steel, aluminum, brass, copper, bronze, zinc, titanium, or suitable alloys of these and other metals. Again, in alternative embodiments, however, as described above, the electrical connector 18 can include a wireless charging pad.

The electrical connector 18 is electrically and thermally coupled to a printed circuit board 24 (positioned between electrical connector 18 and heat sink 23) via one or more connector pins 25. The one or more connector pins 25 can be coupled to the printed circuit board 24, via soldering, for example; other means of coupling the one or more connector pins 25 to the printed circuit board 24, such as welding, fastening, etc., are also within the scope of the subject matter disclosed herein. The one or more connector pins 25 generally comprise electrically conductive material, such as an electrically conductive metal, with high thermal conductivity, for example the same types of materials comprising electrical connector 18. Non-limiting embodiments of materials for connector pins 25 comprise stainless steel, aluminum, brass, copper, bronze, zinc, titanium, or suitable alloys of these and other metals. Moreover, in some embodiments, the one or more connector pins 25 may comprise material that may be the same or different from the material of the electrical connector 18.

An interface pad 26 is positioned between printed circuit board 24 and heat sink 23. As shown in FIG. 3A, connector pins 25 protrude through printed board 24 and at least partially into interface pad 26. In this manner, connector pins 25 provide a thermal pathway for thermal energy to flow from battery pack 14 to interface pad 26. Interface pad 26 may also contact a portion of the underside of printed circuit board 24 and thereby provide a thermal pathway for thermal energy to flow from printed circuit board 24 to interface pad 26. In other embodiments which include a wireless charging pad, the interface pad 26 can contact with or, more generally, interface with the wireless charging pad.

Interface pad 26 is generally configured to electrically isolate electrical connector 18 and printed circuit board 24 from heat sink 23. For example, in some embodiments, interface pad 26 may comprise elastomers or polymers with electrically insulating properties and high thermal conductivity. In some embodiments, interface pad 26 may comprise thermally conductive materials, such as graphite, for example, and can be coated with electrically insulating materials, such as having external dielectric layers. In this manner, interface pad 26 can provide a thermally conductive path to heat sink 23 while electrically insulating heat sink 23 from electrical connector 18 and printed circuit board 24.

In particular, the interface pad 26 is configured to thermally conduct thermal energy from battery pack 14 through battery connector 18, printed circuit board 24, and interface pad 26 to heat sink 23. As shown in FIGS. 2 and 3A, heat sink 23 is sized and shaped to have a relatively large surface area to dissipate the thermal energy conductively transferred thereto through thermal conduction, convection and/or thermal radiation. Heat sink 23 can comprise stainless steel, aluminum, brass, copper, bronze, zinc, titanium, or suitable alloys of these and other metals with thermal conductivity suitable to dissipate thermal energy from battery pack 14. Through the dissipation of thermal energy from battery pack 14 via heat sink 23 and interface pad 26, the temperature of the battery pack 14 can be lowered and maintained at or below the predetermined threshold temperature.

Battery charging system 10 can also, alternatively or additionally, include a second heat exchange module 21, which facilitates dissipating thermal energy generated in battery packs 14 or provides thermal energy to the battery packs 14 during, or prior to, the charging process. By dissipating thermal energy, the temperature of individual battery cells within battery packs 14 can be maintained at or below a threshold temperature where battery cell performance and lifetime are adversely affected. By providing thermal energy, the temperature of individual battery cells within the battery cells within battery packs 14 can be maintained at or above a threshold temperature where battery cell performance and lifetime are adversely affected. Second heat exchange module 21 includes one or more fluid sources 28 (FIG. 4) and a plenum 30 disposed around receptacle 16 for battery pack 14. The one or more fluid sources 28, such as, for example, a cooling or heating fan 29, supply a fluid medium, such as, for example, air. The fluid source or sources 28, such as fan 29, is in fluid communication with plenum 30. Referring to FIGS. 1, 2, 3B, and 4-7B, fluid source 28, e.g., fan 29, and plenum 30 are disposed in an interior space of housing 11 of battery charging system 10. Housing 11 also houses various other components of battery charging system 10, such as electrical connector 18 and battery compartment 12. As shown in FIG. 4, fluid source 28 is positioned between a pair of side members 31 that are coupled to plenum 30 and define an inlet 32. The fluid medium, e.g., air, flows through inlet 32 into plenum 30 in a direction indicated by arrows identified by reference numerals 33a, 33b. While the embodiment of the second heat exchange module 21 described herein includes air as the fluid medium, other fluid mediums and associated fluid sources, such as water, or other liquids and gases, for example, are also within the scope of the subject matter disclosed herein.

Plenum 30 includes a chamber 34 in fluid communication with inlet 32. Chamber 34 receives fluid medium from fluid source 28. In particular, plenum 30 includes an outer wall 35 and a base wall 36. Outer wall 35 extends in an upward direction substantially parallel to a longitudinal axis 3 (FIG. 5) of receptacle 16 from a first end 37 of plenum 30 to a second end 38 of plenum 30. Base wall 36 extends from first end 37 of outer wall 35 in a direction towards and substantially perpendicular to longitudinal axis 3 (FIG. 5) of receptacle 16, terminating at an outer surface 39 of a lower side wall 40 of battery compartment 12.

Lower side wall 40 of battery compartment 12 and an upper side wall 42 of battery compartment 12, at least in part, define receptacle 16 which receives battery pack 14. More particularly, lower side wall 40 includes an external surface 43 and an internal surface 45; and upper side wall 42 includes an external surface 44 and an internal surface 46, where external surfaces 43, 44 of lower and upper side walls 40, 42 define receptacle 16 which receives battery packs 14. Internal surfaces 45, 46 of lower side wall 40 and upper side wall 42 and internal surfaces of outer wall 35 and base wall 36 of plenum 30 together, at least in part, define chamber 34 into which and through which the fluid medium flows. Thus, when fluid source 28 is operated, fluid medium enters chamber 34 of plenum 30 through inlet 32 and flows in the direction indicated by the arrows identified by reference numerals 33a, 33b. As the fluid medium flows through chamber 34 which surrounds receptacle 16, it may absorb thermal energy (generated during the charging process) from battery packs 14, or provide thermal energy to the battery packs 14, for example, during colder environments via a heating fan, or heated fluid sources, such as water, or other liquids and gases.

Figure 3B:
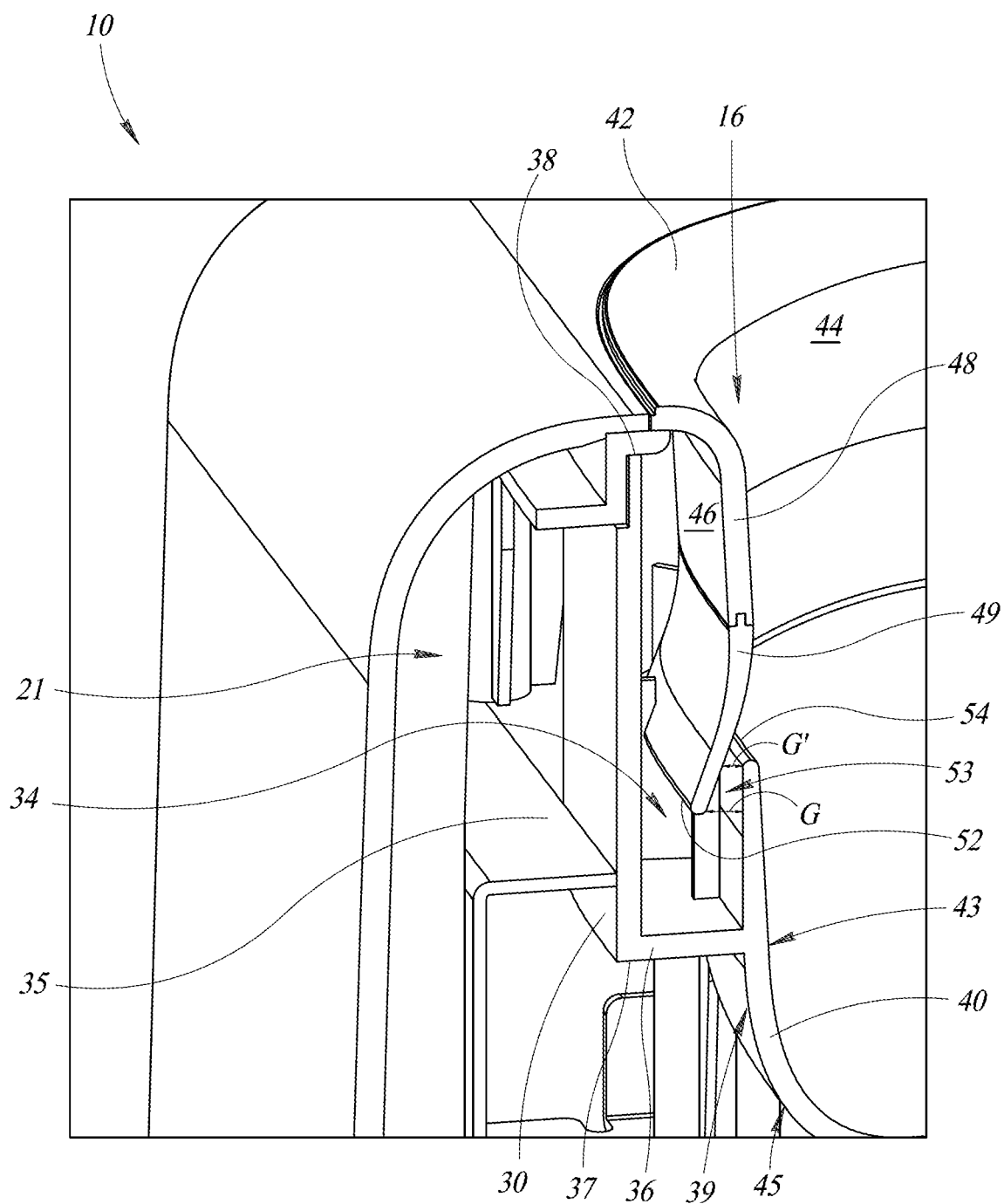
FIG. 3B is a detail perspective view of a portion of the battery charging system of FIG. 1, illustrating certain features of another heat exchange module of the battery charging system of FIG. 1, in accordance with one non-limiting embodiment of the subject matter described herein.
Figure 4:
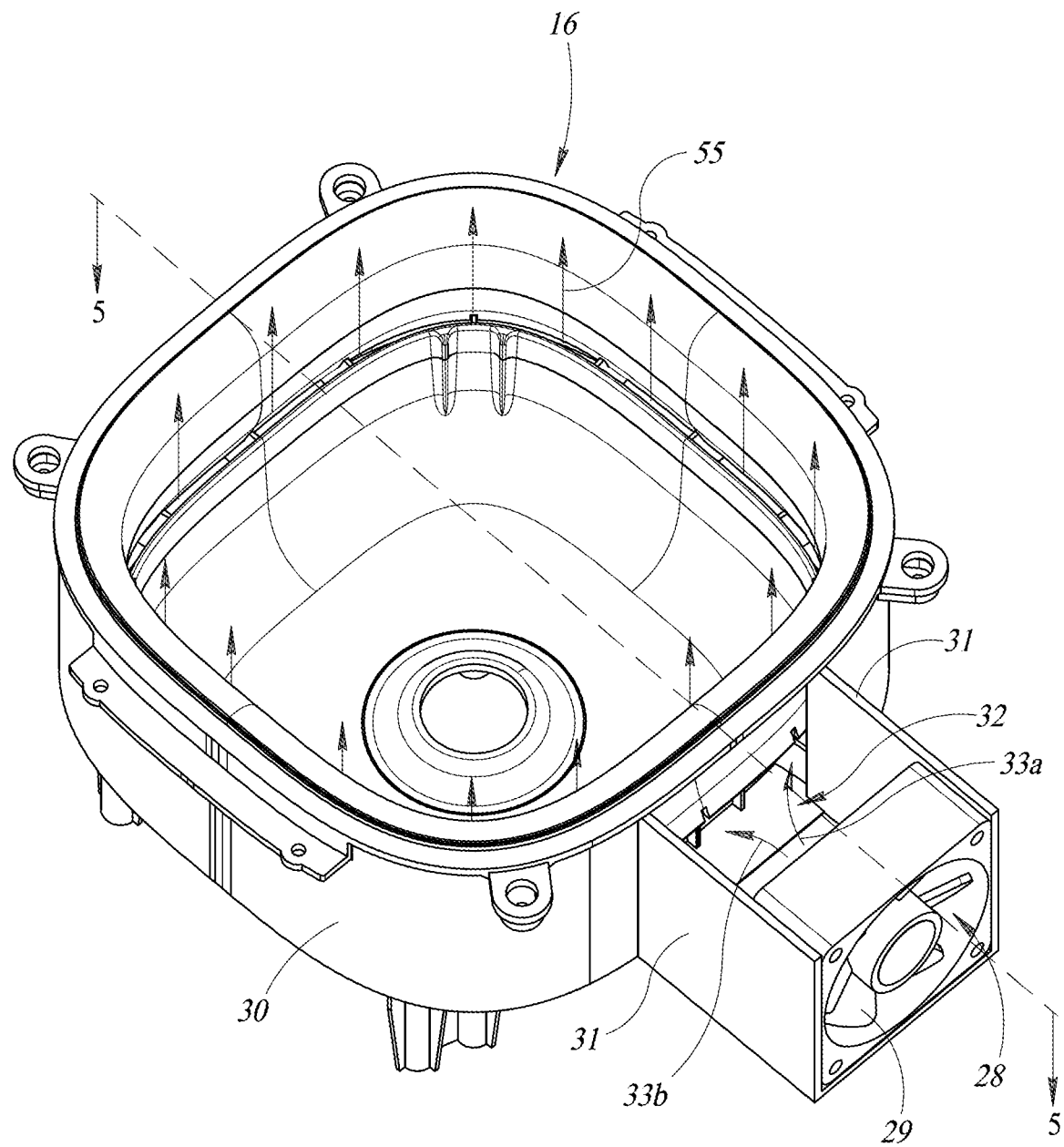
FIG. 4 is a perspective view of a portion of the battery charging system of FIG. 1, illustrating certain features of a plenum, in accordance with one non-limiting embodiment of the subject matter described herein.
Figure 5:
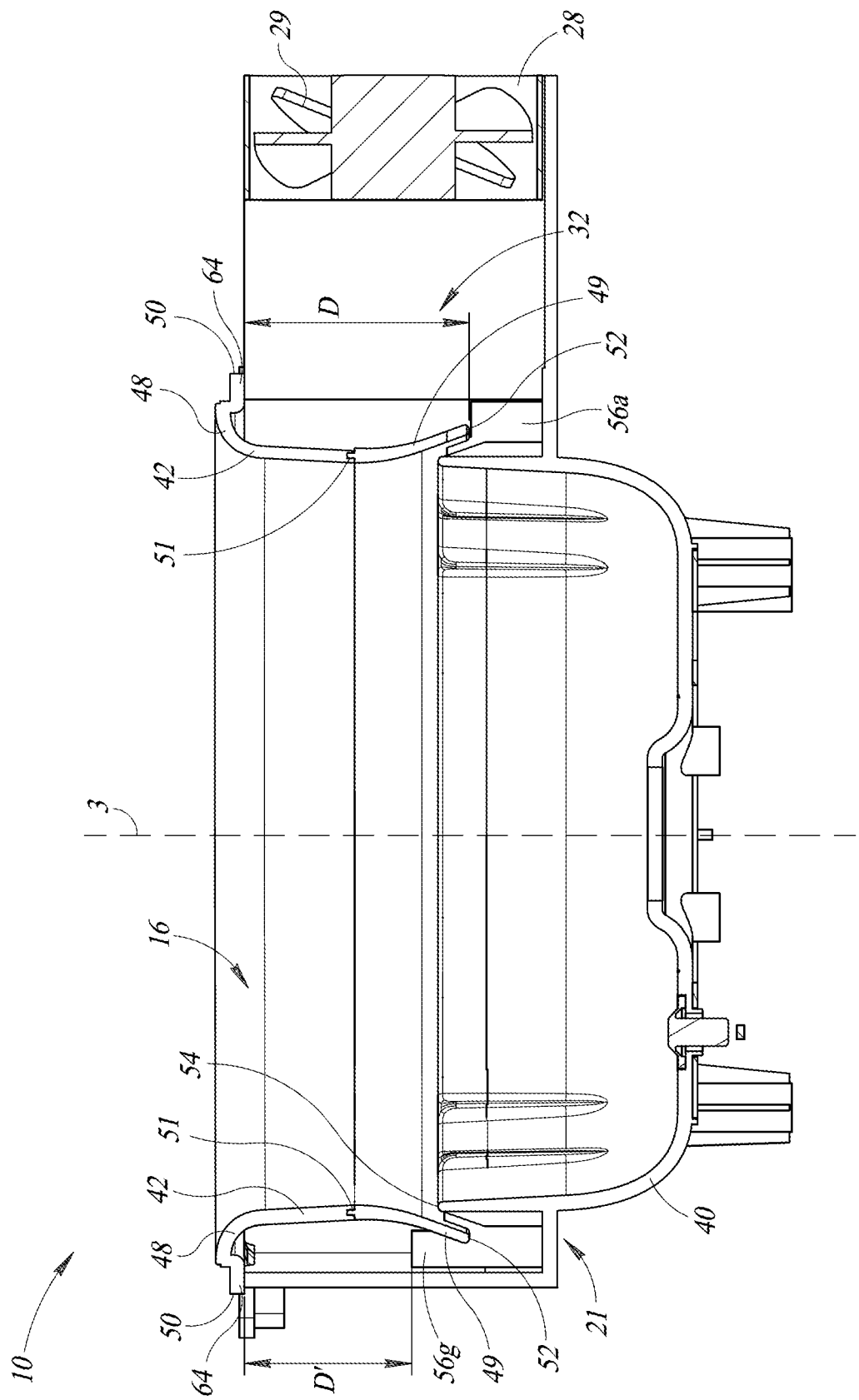
FIG. 5 is a cross-sectional view of the portion of the battery charging system illustrated in FIG. 4 taken along line 5-5.

In particular, referring more specifically to FIG. 3B and FIG. 5, upper side wall 42 includes a first portion 48 and a second portion 49. First portion 48 extends from a first end 50 of first portion 48 to a second end 51 of first portion 48. Second portion 49 extends from second end 51 of first portion 48 terminating at a terminal end 52 of second portion 49. Second portion 49 extends in a substantially arcuate manner to create a variable gap region 53 between at least a portion of second portion 49 and at least a portion of lower side wall 40 of battery compartment 12. As shown in FIG. 3B, variable gap region 53 includes a gap G between terminal end 52 of second portion 49 and a portion of lower side wall 40 and gradually decreases to gap G' proximate a terminal end 54 of lower side wall 40. Variable gap region 53 is sized and configured to act like a nozzle through which the fluid in chamber 34 may pass. Cooling or heating fluid in chamber 34 is caused to pass through variable gap region 53 by a pressure differential between chamber 34 of plenum 30 and battery compartment 12. The pressure differential, for example, a lower pressure in variable gap region 53 relative to the other regions of chamber 34, advantageously causes an increase in flow velocity of the fluid medium as it exits variable gap region 53. As the fluid medium exits variable gap region 53 it is directed toward battery pack 14 in a flow direction that includes the direction indicated by the arrow identified by reference numeral 55 (FIG. 4). This flow of fluid medium may absorb thermal energy from the battery pack 14 via convection or other heat transfer principle and thereby dissipate thermal energy generated in the battery pack 14 during a charging process. In alternative embodiments, this flow of fluid medium may provide thermal energy to the battery pack 14 to maintain the temperature at or above predetermined threshold temperatures during, or prior to, a charging process.

Referring now more specifically to FIGS. 4-7B, plenum 30 includes a plurality of flow guides (e.g., flow guides 56a-56h) that are sized and configured to facilitate and promote a uniform flow distribution of the fluid medium throughout chamber 34 and thereby around battery packs 14. The plurality of flow guides (e.g., flow guides 56a-56h) disposed within chamber 34 of plenum 30 promote the uniform flow distribution of the fluid medium throughout chamber 34, for example, by controlling the flow rate of the fluid medium through a variable flow passage, as discussed in further detail below.

Figure 6:
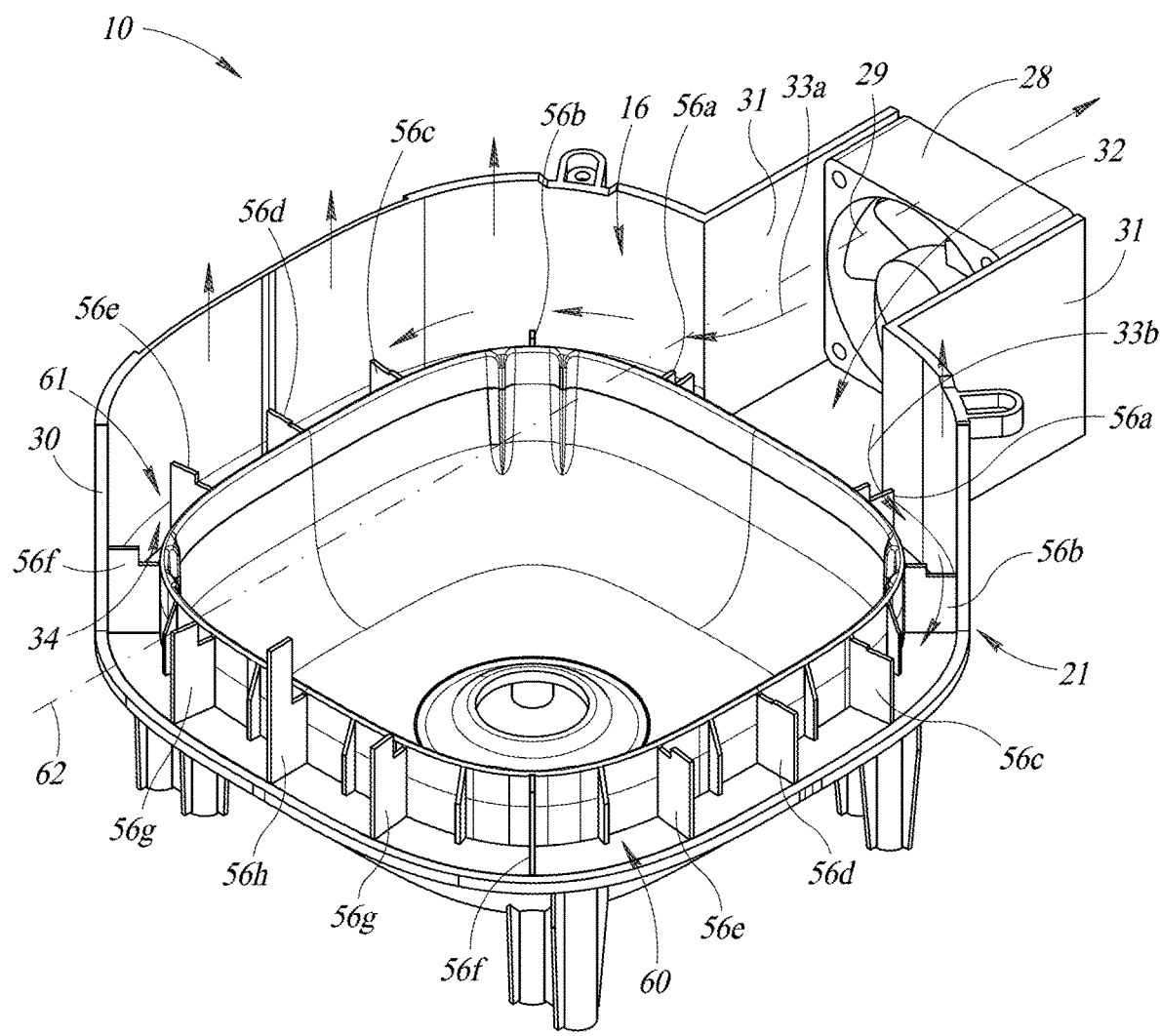
FIG. 6 is a partial cutaway perspective view of the portion of the battery charging system illustrated in FIG. 4.
Figure 7A:
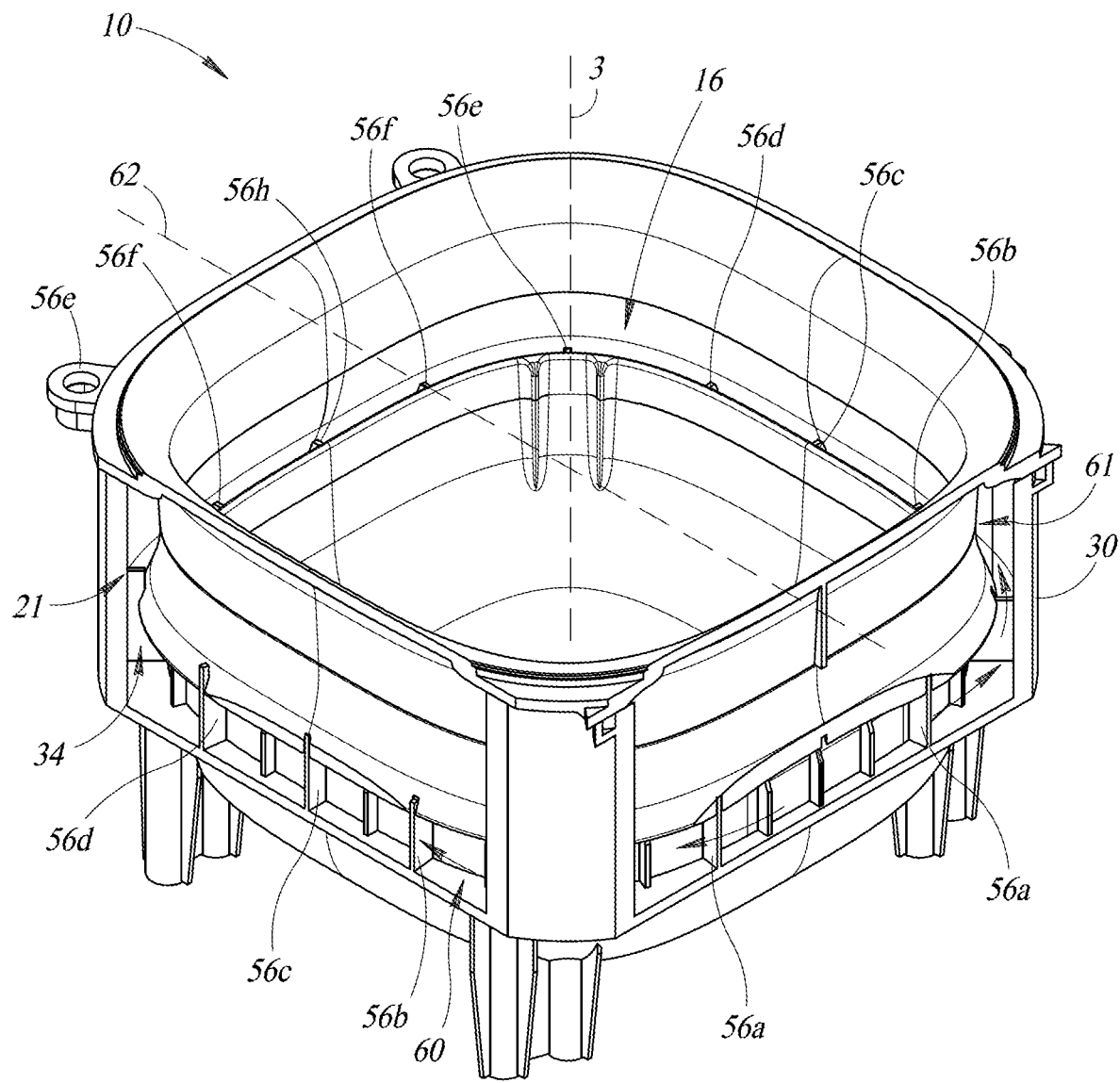
FIG. 7A is another partial cutaway perspective view of the portion of the battery charging system illustrated in FIG. 4.
Figure 7B:
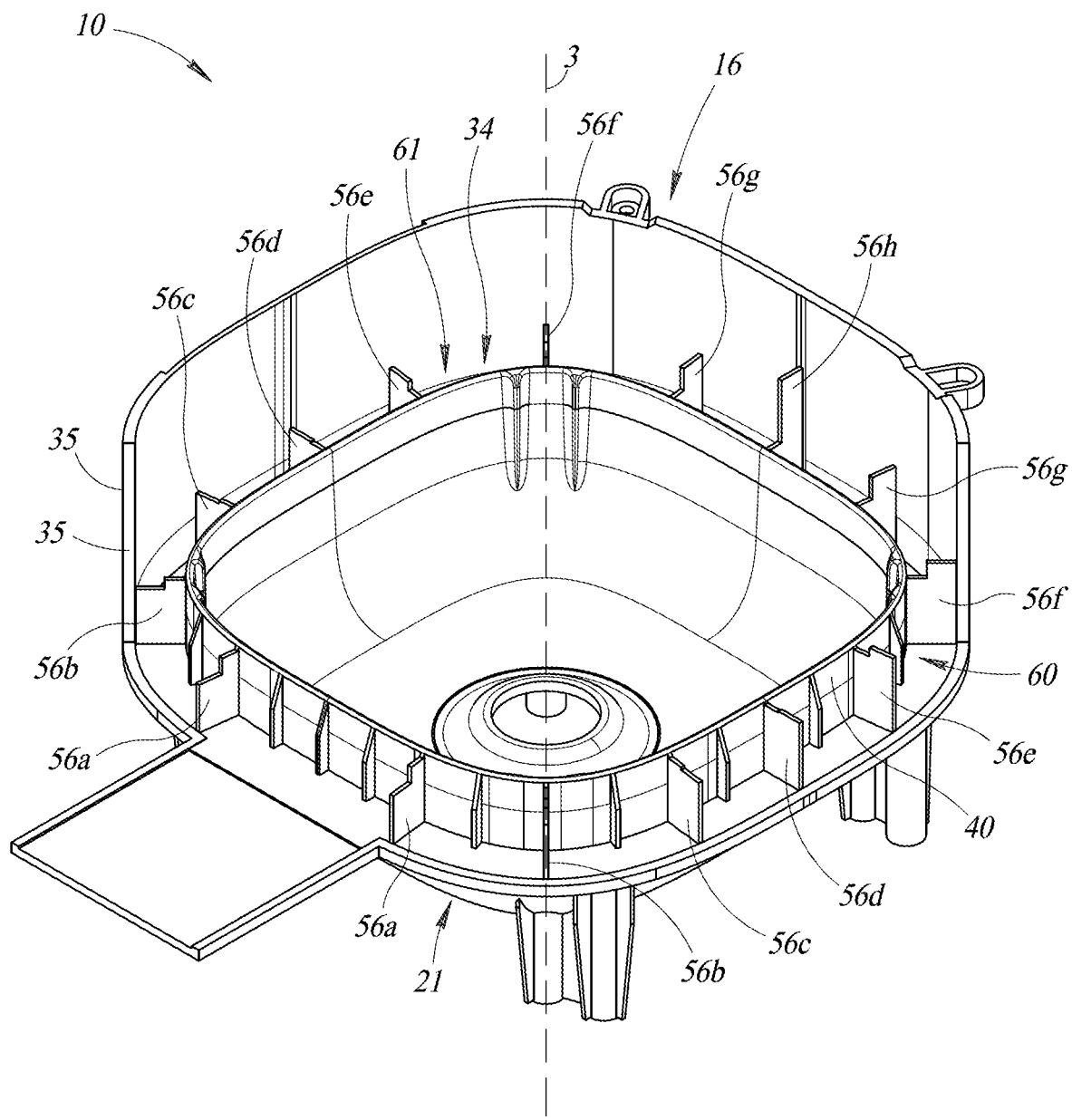
FIG. 7B is another partial cutaway perspective view of the portion of the battery charging system illustrated in FIG. 4.

A plurality of flow guides (e.g., flow guides 56a-56h) are disposed within chamber 34 of plenum 30. In particular, plenum 30 includes a first perimeter 60 and a second perimeter 61 that is a mirror image of first perimeter 60 about a lateral axis 62 (FIG. 7A) of plenum 30. As shown in FIGS. 6 and 7A-B, where certain components of battery charging system 10 have been removed for clarity of description and illustration, plenum 30 includes a pair of first flow guides 56a that are positioned proximal to fluid source 28 and are spaced apart relative to lateral axis 62 of plenum 30, with one of the first flow guides 56a disposed in first perimeter 60 and the other one of first flow guide 56a disposed in second perimeter 61. Plenum 30 further includes a pair of second flow guides 56b, where each of second flow guides 56b is spaced apart from first flow guides 56a along the respective first and second perimeters 60, 61. Each of the pair of second flow guides 56b is also spaced apart from the other relative to the lateral axis 62 of plenum 30. Similarly, the plenum 30 also includes pairs of third flow guides 56c, fourth flow guides 56d, fifth flow guides 56e, sixth flow guides 56f, seventh flow guides 56g, and an eighth flow guide 56h, where the third, fourth, fifth, sixth, seventh, and eighth flow guides 56c-56h are spaced apart from each other along the respective first and second perimeters 60, 61, and each of the pairs of third, fourth, fifth, sixth, and seventh flow guides 56c-56g are spaced apart from the other relative to lateral axis 62 of plenum 30. Flow guides 56a-56h extend from outer wall 35 (FIG. 3B) toward receptacle 16 and substantially parallel to longitudinal axis 3 of receptacle 16 and from base wall 36 toward an interior surface of a lip portion 64 (FIG. 5) of first portion 48 of upper side wall 42. In particular, the flow guides, for example, first flow guide 56a shown in FIG. 5, extends a certain first distance substantially parallel to longitudinal axis 3 of receptacle 16 toward an interior surface of lip portion 64 of first portion 48 of upper side wall 42 to define a first depth of flow D. The second flow guides 56b extend a certain distance substantially parallel to longitudinal axis 3 of receptacle 16 toward the interior surface of lip portion 64 of first portion 48 of upper side wall 42 a certain second distance to define a second depth of flow that is greater than first depth of flow D. As best seen in FIGS. 5 and 6, the flow guides occupy all or a substantial portion of a cross-section of chamber 34 below terminal end 52 of second portion 59 of receptacle 16.

In a similar manner, third flow guides 56c extend a certain third distance substantially parallel to longitudinal axis 3 of receptacle 16 toward the interior surface of lip portion 64 of first portion 48 of upper side wall 42 that is greater than a fourth distance fourth flow guides 56d extend; fifth flow guides 56e extend a certain fifth distance substantially parallel to longitudinal axis 3 of receptacle 16 toward the interior surface of lip portion 64 of first portion 48 of upper side wall 42 that is greater than the fourth distance fourth flow guides 56d extend; sixth flow guides 56f extend a certain sixth distance substantially parallel to longitudinal axis 3 of receptacle 16 toward the interior surface of lip portion 64 of first portion 48 of upper side wall 42 that is greater than the fifth distance fifth flow guides 56e extend; seventh flow guides 56g extend a certain seventh distance substantially parallel to longitudinal axis 3 of receptacle 16 toward the interior surface of lip portion 64 of first portion 48 of upper side wall 42 that is greater than the sixth distance sixth flow guides 56f extend; and eighth flow guide 56h extends extend a certain eighth distance substantially parallel to longitudinal axis 3 of receptacle 16 toward the interior surface of lip portion 64 of first portion 48 of upper side wall 42 that is greater than the seventh distance seventh flow guides 56g extend.

In this manner, each of the flow guides 56a-56h create corresponding depths of flow that gradually decrease from first depth of flow D to the eighth depth of flow. For example, FIG. 5 shows a seventh depth of flow D', corresponding to the depth of flow created by seventh flow guide 56g, that is less than first depth of flow D. In the illustrated embodiment the depths of flow created by the different flow guides gradually decreases from the first depth of flow D to the seventh depth of flow D'. The variable depths of flow from first flow guide 56a to eighth flow guide 56h create a variable flow passage. The depths of flow or the variable flow passage is sized and configured to generate pressure differentials between a flow of the fluid medium upstream of the flow guides 56a-56h and downstream of the flow guides 56a-56h and/or a pressure differential along the variable flow passage around first perimeter 60 and second perimeter 61. In particular, the flow guides, and thus the variable flow passage can be sized and configured to control the flow rate of the fluid medium along first perimeter 60 and second perimeter 61, such that flow of medium through variable gap region 53 can be tailored to be more uniform along first perimeter 60 and second perimeter 61 or less uniform along first perimeter 60 and second perimeter 61.

While a specific embodiment has been described with reference to depths of flow created by the different flow guides gradually decreasing from first depth of flow D to second depth of flow D', it is understood that different patterns of variance in the depth of flow provided by the different flow guides are within the scope of the present disclosure. For example, the flow guides can be the same size so that each flow guide provides the same depth of flow or they may be of different sizes so as to provide different depths of flow in many different patterns. The particular pattern of depths of flow desired will depend at least in part on how much cooling or heating respective portions of the battery pack require. For example, depths of flow can be arranged so that the amount of fluid flowing through the variable gap region 53 is largest adjacent those portions of the battery pack that would benefit the most by increased cooling or heating and the amount of fluid flowing through the variable gap region 53 is smallest adjacent those portions of the battery pack that would benefit the least by increased cooling or heating. Moreover, in some embodiments, flow guides may be omitted and the variance in the depth of flow can be provided by, for example, altering, modifying, or changing the shapes, positioning, or dimensions of the walls of the plenum 30 to define a varying flow passage within the chamber 34.

Figure 8:
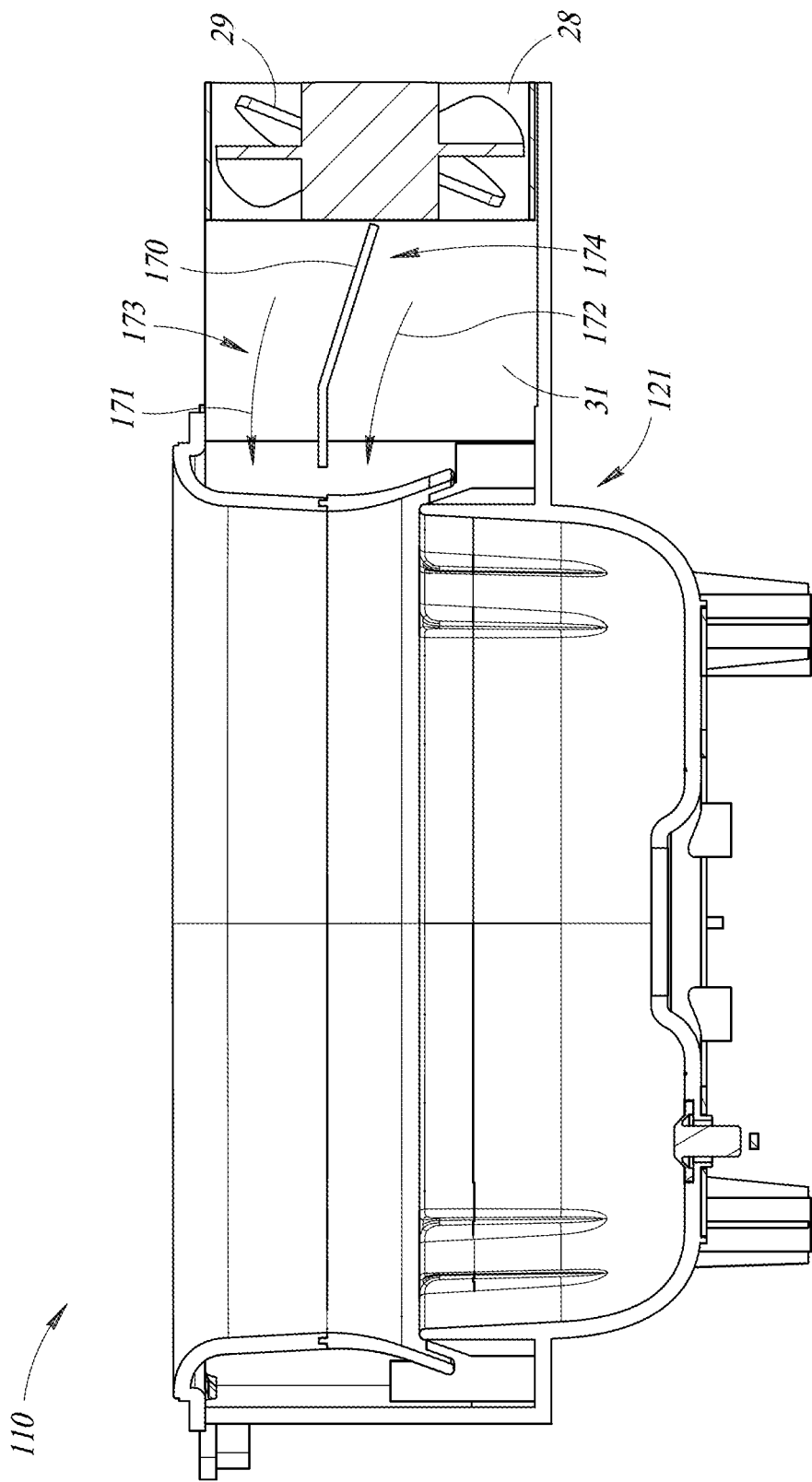
FIG. 8 is a cross-sectional view of a portion of a battery charging system according to another non-limiting embodiment of the subject matter described herein.

FIG. 8 illustrates a cross-sectional view of a battery charging system 110 according to another non-limiting embodiment, where certain components of the battery charging system 110 have been removed for clarity of description and illustration. The battery charging system 110 shown in FIG. 8 is generally similar to the other embodiments of the battery charging systems described herein, but provides a variation in which the battery charging system 110 includes a second heat exchange module 121 providing a bifurcated flow of fluid medium. More particularly, second heat exchange module 121 includes a fluid source 28, e.g., a cooling or heating fan 29, positioned between a pair of side members 31 that are coupled to plenum 30. Second heat exchange module 121 also includes a partition member 170 extending between side members 31. Partition member 170 separates the space between side members 31 into an underlying first inlet 174 and an overlying second inlet 173. As shown in FIG. 8, first inlet 174 receives a first flow of fluid medium identified by the arrow identified by reference number 172 and the second inlet 173 receives a second flow of fluid medium identified by the arrow identified by reference numeral 171. These two flows of medium provide a bifurcated flow of fluid medium into chamber 34 of plenum 30. In general, the location and shape of partition member 170 can be selected to provide a desired bifurcated flow distribution of fluid, whether that be a uniform bifurcation or a non-uniform bifurcation of the cooling fluid medium. For instance, in some aspects, the positioning, size, or shape of the partition member 170 can be adjusted, modified, or altered in any manner such that the first layer 172 of flow of fluid medium and the second layer 171 of flow of fluid medium collectively provide a uniform flow distribution of the fluid medium or a non-uniform flow distribution of fluid medium.

Figure 9:
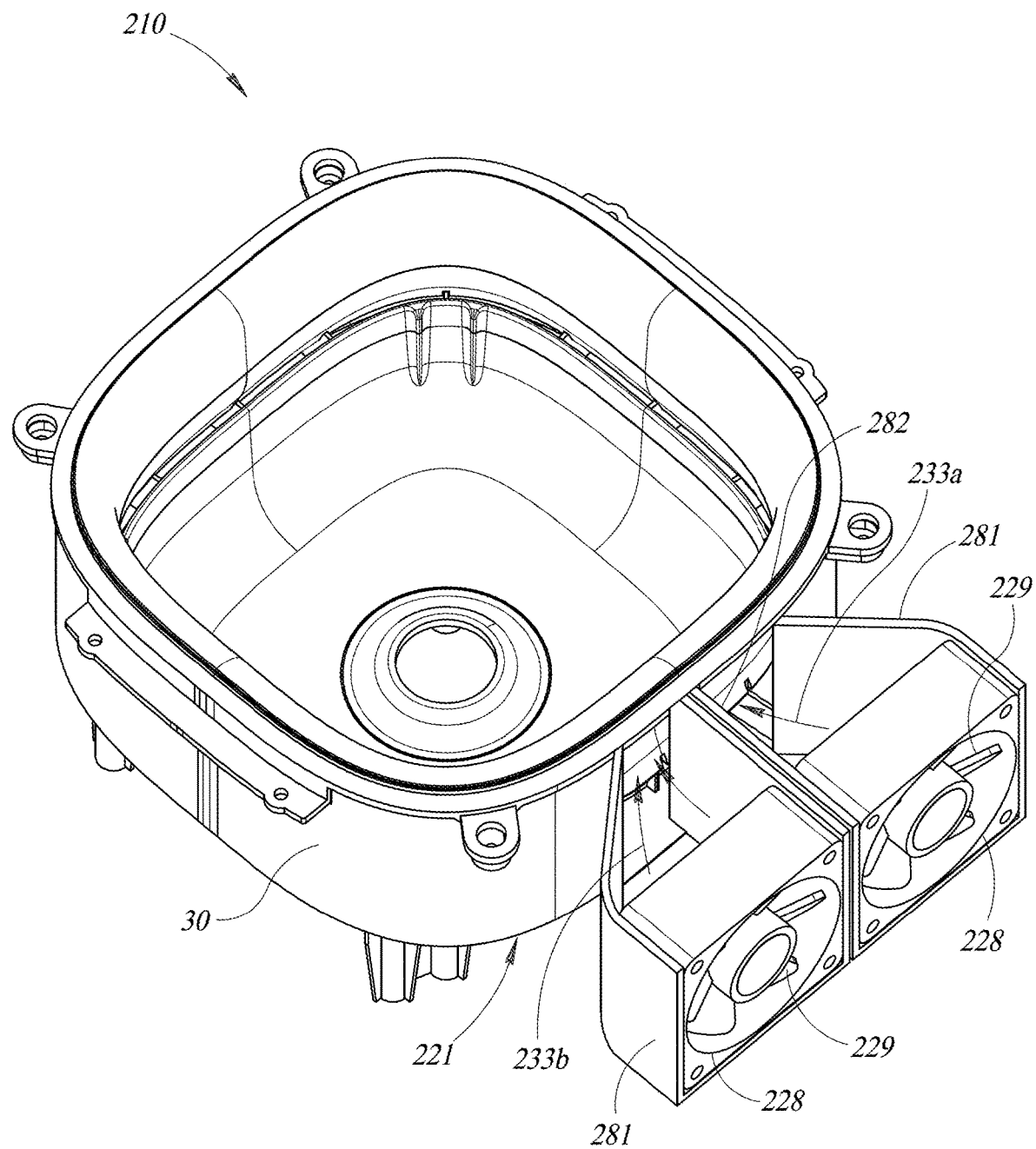
FIG. 9 is a partial perspective view of a portion of a battery charging system, in accordance with another non-limiting embodiment of the subject matter described herein.

FIG. 9 illustrates a partial perspective view of a battery charging system 210 according to another embodiment, where certain components of the battery charging system 210 have been removed for clarity of description and illustration. The battery charging system 210 shown in FIG. 9 is generally similar to the other embodiments of the battery charging systems described herein, but provides a variation in which the battery charging system 210 includes a second heat exchange module 221 having a pair of fluid sources, 228, e.g., cooling or heating fans 229. More particularly, each of the fluid sources 228 is positioned between a side member 281 and a dividing member 282 that are coupled to the plenum 30. The side members 281 and the dividing members 282 define corresponding inlets through which the fluid medium flows to chamber 34 of plenum 30, as indicated by arrows corresponding to reference numerals 233a, 233b. The arrangement of dividing members 282 and/or the size of fans 229 can be chosen so that the flow of the fluid medium from the respective fluid sources is distributed uniformly or non-uniformly. For instance, in some aspects, the positioning, size, or shape of the dividing members 282 or fans 229 can be adjusted, modified, or altered in any manner such that the flow of the fluid medium collectively is distributed uniformly or non-uniformly.

While the embodiments of flow guides 56a-56h illustrated in FIGS. 4-9 are equally spaced apart relative to the other, in other embodiments, the flow guides may be unequally spaced apart relative to the other. The spacing and the number of flow guides 56a-56h can be adjusted, modified, or altered in any way to control the flow rate of the fluid medium such that a uniform or non-uniform flow distribution of the fluid medium is maintained around chamber 34 of plenum 30. Similarly, while the embodiments of flow guides 56a-56h specifically described and illustrated herein comprise substantially polygonal shapes, other shapes, sizes, or forms of the flow guides 56a-56h are within the scope of the subject matter disclosed herein. For example, in some embodiments, the flow guides may have a substantially cylindrical or arcuate shape. In general, the shapes, sizes, or forms of the flow guides can be adjusted, modified, or altered to provide variable flow passages to control the flow rate of the fluid medium such that a uniform or non-uniform flow distribution of the fluid medium is maintained around chamber 34 of plenum 30.

The battery charging system (e.g., battery charging systems 10, 110, 210) may further include one or more controllers that are communicatively coupled to the fluid source 28. The one or more controllers can be configured to control the flow rate of the fluid medium from the fluid source 28, for example, by controlling the speed or rotation direction of the fan 29.

The controller may include a microcontroller and drivers to control and drive the fluid source 28. Moreover, the microcontroller may comprise a microprocessor, memory, and a plurality of peripheral devices to form a system on a chip that may be applicable for a wide variety of applications. For example, the battery charging system (e.g., battery charging systems 10, 110, 210) may include one or more sensors, flow meters, pressure sensors or similar devices to determine characteristics of the flow of the fluid medium. For instance, the battery charging system (e.g., battery charging systems 10, 110, 210) may include one or more sensors, flow meters, pressure sensors or similar devices positioned proximate the flow guides (e.g., flow guides 56a-56h), to sense and communicate the characteristics of the flow of the fluid medium to the controller.

More generally, a control system that operates the embodiments of the apparatuses, systems, and methods described herein may include, without limitation, one or more computing devices, such as processors, microprocessors, digital signal processors (DSP), application-specific integrated circuits (ASIC), and the like. To store information, the control system may also include one or more storage devices, such as volatile memory, non-volatile memory, read-only memory (ROM), random access memory (RAM), and the like. The storage devices can be coupled to the computing devices by one or more buses. The control system may further include one or more input devices (e.g., displays, keyboards, touchpads, controller modules, or any other peripheral devices for user input) and output devices (e.g., displays screens, light indicators, and the like). The control system can store one or more programs for processing any number of different apparatuses, systems, and methods according to various embodiments described herein to detect the operating conditions of motors. The control system, according to one embodiment, may be provided in the form of a general purpose computer system. The computer system may include components such as a CPU, various I/O components, storage, and memory. The I/O components may include a display, a network connection, a computer-readable media drive, and other I/O devices (a keyboard, a mouse, speakers, etc.). A control system manager program may be executing in memory, such as under control of the CPU, and may include functionality related to detecting and adjusting the flow distribution of the cooling fluid medium described herein.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A battery charging apparatus, comprising:
a battery compartment having a receptacle configured to receive a battery pack;
a fluid source configured to supply a fluid; and
a first heat exchange module including:
a plenum having a gap completely around a perimeter of the receptacle and configured to direct a fluid medium to the battery pack, the plenum including a chamber in fluid communication with the fluid source, wherein the gap directs the fluid medium to pass in a direction toward a center axis of the battery compartment, and wherein the gap is formed by a terminal end from an upper portion of the receptacle and a sidewall from a lower portion of the receptacle, and wherein the terminal end extends toward the lower portion and away from the center axis of the battery compartment, wherein the fluid medium exits from the chamber to the gap and then towards the battery compartment, wherein the gap is circumferentially formed in a plane perpendicular to the center axis of the battery compartment; and
a plurality of flow guides disposed in the chamber.

2. The battery charging apparatus of claim 1 wherein the chamber extends around the perimeter of the receptacle, and wherein gap defines a variable distance between the terminal end and the sidewall.

3. The battery charging apparatus of claim 2 wherein the perimeter includes a first perimeter and a second perimeter that is a mirror image of the first perimeter across a longitudinal axis of the receptacle, the first perimeter including at least some of the plurality of flow guides, the at least some of the plurality of flow guides creating respective first depth of flow that decreases from a first end of the first perimeter proximal to the fluid source to a second end of the first perimeter distal to the fluid source.

4. The battery charging apparatus of claim 3 wherein the second perimeter includes at least some of the plurality of flow guides, the at least some of the plurality of flow guides included in the second perimeter creating respective second depth of flow that decreases from a first end of the second perimeter proximal to the fluid source to a second end of the second perimeter distal to the fluid source.

5. The battery charging apparatus of claim 1 wherein the plurality of flow guides create a variable flow passage including a first depth of flow defined by a first flow guide among the plurality of flow guides positioned proximal to the fluid source and a second depth of flow created by a second flow guide among the plurality of flow guides positioned distal to the fluid source, the first depth of flow being different than the second depth of flow.

6. The battery charging apparatus of claim 1 wherein the chamber is defined at least in part by an outer wall of the plenum, a base wall of the plenum, a lower side wall of the battery compartment and an upper side wall of the battery compartment.

7. The battery charging apparatus of claim 6 wherein the upper side wall of the battery compartment includes an arcuate portion a terminal end of which is spaced apart from the lower side wall of the battery compartment.

8. The battery charging apparatus of claim 1, further comprising:
a partition member positioned proximal to the fluid source, the partition member arranged to bifurcate a flow of the fluid from the fluid source into an upper flow stream and a lower flow stream.

9. The battery charging apparatus of claim 1, further comprising:
a second heat exchange module including:
a battery connector; and
a heat sink coupled to the battery connector.

10. The battery charging apparatus of claim 9, further comprising:
an interface pad coupled to the battery connector and the heat sink.

11. The battery charging apparatus of claim 10 wherein the interface pad comprises an electrically non-conductive material.

12. The battery charging apparatus of claim 10 wherein the battery connector includes a connector pin extending at least partially into the interface pad.

13. A battery charging system, comprising:
a battery compartment having a receptacle configured to receive a battery pack;
a fluid source configured to supply a fluid; and
a first heat exchange module including:
a plenum having a gap completely around a perimeter of the receptacle and configured to direct a fluid medium to the battery pack, the plenum including a chamber in fluid communication with the fluid source and a variable flow passage, wherein the gap directs the fluid medium to pass in a direction toward a center axis of the battery compartment, and wherein the gap is formed by a terminal end from an upper portion of the receptacle and a sidewall from a lower portion of the receptacle, and wherein the terminal end extends toward the lower portion and away from the center axis of the battery compartment, wherein the fluid medium exits from the chamber to the gap and then towards the battery compartment, wherein the gap is circumferentially formed in a plane perpendicular to the center axis of the battery compartment.

14. The battery charging system of claim 13, further comprising:
a plurality of flow guides disposed in the chamber, the plurality of flow guides creating the variable flow passage,
wherein the gap defines a variable distance between the terminal end and the sidewall.

15. The battery charging system of claim 14 wherein the plurality of flow guides include a first depth of flow defined by a first flow guide among the plurality of flow guides positioned proximal to the fluid source and a second depth of flow created by a second flow guide among the plurality of flow guides positioned distal to the fluid source, the first depth of flow being different than the second depth of flow.

* * * * *